(12) United States Patent
Okuyama et al.

(10) Patent No.: US 8,599,357 B2
(45) Date of Patent: Dec. 3, 2013

(54) PHOTOLITHOGRAPHY SYSTEM

(75) Inventors: Takashi Okuyama, Saitama (JP); Yoshinori Kobayashi, Tokyo (JP)

(73) Assignee: Orc Manufacturing Co., Ltd., Tokyo (JP)

( * ) Notice: Subject to any disclaimer, the term of this patent is extended or adjusted under 35 U.S.C. 154(b) by 580 days.

(21) Appl. No.: 12/185,202

(22) Filed: Aug. 4, 2008

(65) Prior Publication Data

US 2009/0040485 A1 Feb. 12, 2009

(30) Foreign Application Priority Data

Aug. 10, 2007 (JP) ................................ 2007-209528

(51) Int. Cl.
G03B 27/42 (2006.01)
G03B 27/32 (2006.01)
G03F 7/20 (2006.01)

(52) U.S. Cl.
CPC ........ *G03F 7/70508* (2013.01); *G03F 7/70291* (2013.01)
USPC ................................ 355/53; 355/77; 359/237

(58) Field of Classification Search
CPC ............ G03F 7/70291; G03F 7/70508; G03F 7/70275; G03F 7/704
USPC ....................... 355/53, 67, 77; 430/5; 359/237
See application file for complete search history.

(56) References Cited

U.S. PATENT DOCUMENTS

| | | | | |
|---|---|---|---|---|
| 4,571,603 A * | 2/1986 | Hornbeck et al. | ............. | 347/239 |
| 5,049,901 A * | 9/1991 | Gelbart | ........................ | 347/239 |
| 5,132,723 A * | 7/1992 | Gelbart | ........................... | 355/40 |
| 5,721,622 A * | 2/1998 | Venkateswar | ................. | 358/3.01 |
| 6,312,134 B1 | 11/2001 | Jain et al. | | |
| 6,473,237 B2 * | 10/2002 | Mei | ............................... | 359/619 |
| 6,509,955 B2 * | 1/2003 | Mei et al. | ......................... | 355/53 |
| 6,870,604 B2 * | 3/2005 | Kanatake | ......................... | 355/77 |
| 6,965,387 B2 * | 11/2005 | Mei et al. | ...................... | 345/649 |
| 7,133,116 B2 * | 11/2006 | Nishimura et al. | ............. | 355/67 |

(Continued)

FOREIGN PATENT DOCUMENTS

| | | |
|---|---|---|
| CN | 1882875 | 12/2006 |
| JP | 2001-135562 | 5/2001 |

(Continued)

OTHER PUBLICATIONS

English language Abstract of JP 2003-57836, Feb. 28, 2003.

(Continued)

*Primary Examiner* — Steven H Whitesell Gordon
(74) *Attorney, Agent, or Firm* — Greenblum & Bernstein, P.L.C.

(57) ABSTRACT

A photolithography system has at least one spatial light modulator, a scanning mechanism configured to move an exposure area relative to a target object in a scanning direction, a plurality of memories ($1^{st}$ to $N^{th}$ memories), a data processor, and exposure controller. The exposure area is defined as a projection area of the spatial light modulator. The plurality of memories corresponds to a plurality of partial exposure areas that is defined by dividing the exposure area. The data processor successively writes exposure data into each memory in accordance with the timing of an exposure, and the exposure controller controls the plurality of light modulating elements on the basis of the relative position of the exposure area. The data processor writes newly generated exposure data into the first memory, and shifts exposure data stored in the $1^{st}$ to $(N-1)^{st}$ memories to the $2^{nd}$ to $N^{th}$ memories, respectively.

9 Claims, 7 Drawing Sheets

(56) References Cited

U.S. PATENT DOCUMENTS

| | | |
|---|---|---|
| 7,199,915 B2 | 4/2007 | Schroeder |
| 7,295,885 B2 | 11/2007 | Okuyama |
| 7,336,391 B2 | 2/2008 | Okuyama |
| 7,812,930 B2 | 10/2010 | Van Den Akker et al. |
| 8,184,333 B2 | 5/2012 | Sugita et al. |
| 2001/0033322 A1* | 10/2001 | Bommersbach et al. ..... 347/232 |
| 2005/0018255 A1 | 1/2005 | Nakaya et al. |
| 2005/0128457 A1 | 6/2005 | Nishimura et al. |
| 2005/0213189 A1* | 9/2005 | Schroeder ..................... 359/291 |
| 2006/0033897 A1* | 2/2006 | Okuyama ........................ 355/53 |
| 2009/0201482 A1 | 8/2009 | Ozaki et al. |

FOREIGN PATENT DOCUMENTS

| | | |
|---|---|---|
| JP | 2003-15309 | 1/2003 |
| JP | 2003-57836 | 2/2003 |
| JP | 2005-55881 | 3/2005 |
| JP | 2005-055881 | 3/2005 |
| JP | 2005-84198 | 3/2005 |
| JP | 2005-284287 | 10/2005 |
| JP | 2005-300807 | 10/2005 |
| JP | 2006-268045 | 10/2006 |
| JP | 2006-330716 | 12/2006 |
| JP | 2007-003861 | 1/2007 |
| WO | 02/041196 | 5/2002 |

OTHER PUBLICATIONS

English language Abstract of JP 2003-15309, Jan. 17, 2003.
English language Abstract of JP 2005-84198, Mar. 31, 2005.
English language Abstract of JP 2005-55881, Mar. 3, 2005.
Chinese Office Action, dated Nov. 16, 2011, together with an English language translation thereof, for corresponding Chinese Patent Application.
China Office Action, mailed Nov. 2, 2012, from The State Intellectual Property Office of China (S.I.P.O.) for corresponding Chinese Patent Application (together with partial English language translation).
Japan Office Action, mailed Oct. 30, 2012, for corresponding Japanese Patent Application.

* cited by examiner

FIG. 5
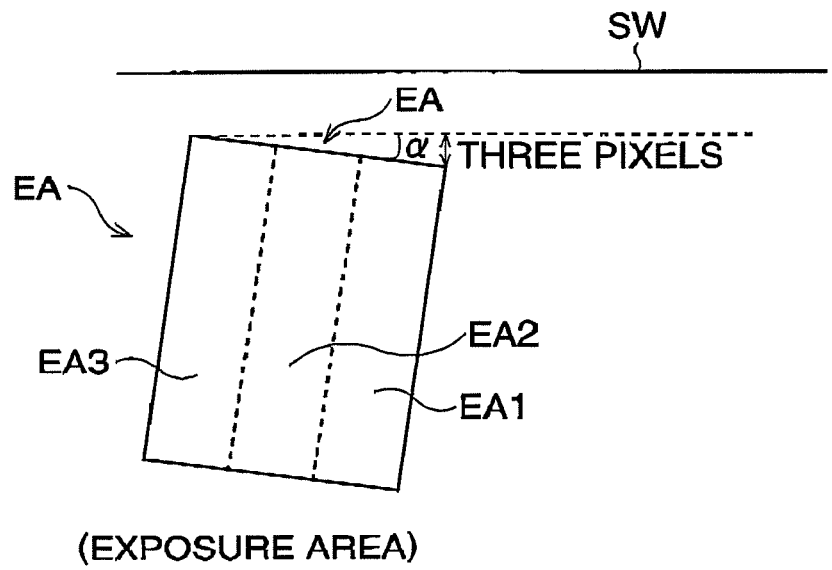
(EXPOSURE AREA)
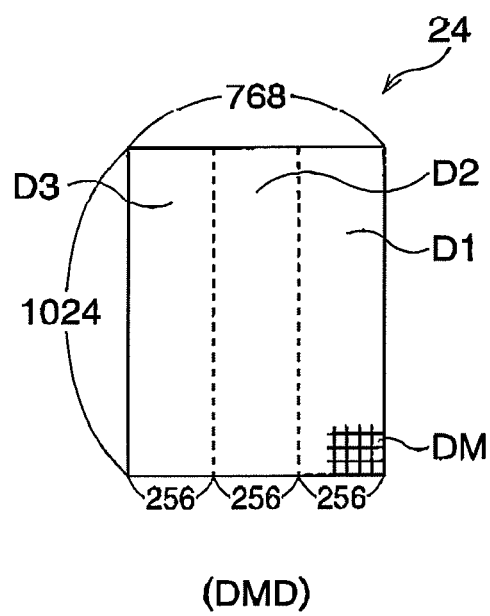
(DMD)

PHOTOLITHOGRAPHY SYSTEM

BACKGROUND OF THE INVENTION

1. Field of the Invention

The present invention relates to a mask- or reticle-free photolithography system that directly writes or forms a pattern on a target object such as a substrate. In particular, it relates to the control of an exposure process.

2. Description of the Related Art

In manufacturing an integrated circuit, a printed circuit board, or photoresist-coated substrate is subjected to photolithography, i.e., an exposure process for imaging a predetermined pattern on the substrate. In a mask- or reticle-free photolithography system, a spatial light modulator with a plurality of two-dimensionally arrayed cells, such as a DMD (Digital Micro-mirror Device) or an LCD (Liquid Crystal Device), is used. Light from a light source is reflected off the modulation cells, each cell (which could be implemented as a mirror, for example) projecting a part of an image on the basis or pattern data.

In the exposure process, a material coated with photoresist is arranged on a table, and the table is moved in a scanning direction relative to the photosensitive material to scan an exposure area that is a projection area of the spatial light modulator. Each cell of the spatial light modulator is modulated, i.e., switched on/off in accordance with the relative position of the exposure area and the pattern data. After the exposure process, a developing process, an etching process, a resist removal process, and so on, are carried out. As for the exposure method, the Step & Repeat process, or the continuous scanning method is used. Furthermore, a multi-exposure method that repeatedly illuminates light on the same area may be utilized.

In a photolithography system connected with a CAD system, pattern data (e.g., vector data) is transmitted to the photolithography system, and the pattern data is converted to the raster data used for controlling the light modulation calls each of the light modulation cells (which may be a micro-mirror) is controlled by the corresponding raster data. Input of the pattern data, processing of the pattern data, and the control of the cells are repeatedly performed in accordance with the relative movement of the exposure area. Namely, the pattern data is renewed every time the exposure area reaches a predetermined area to be exposed. These photolithography systems are disclosed in Japanese Patent publications, No. 2003-57836A, No. 2003-15309A.

The frequent renewal of enormous quantities of pattern data takes a lot of time, and influences the total exposure time, i.e., throughput. To reduce the load of the data process, for example, vector data having coordinate information is subjected to a coordinate transform process, and a part of the transferred vector data is sampled. Also, the reflection surface of a DMD is divided into a plurality of areas, and mirrors are reset in each area after raster data is transmitted to the mirror. These photolithography systems are disclosed in Japanese Patent publication No. 2005-84198A and No. 2005-55881.

The spatial light modulator is composed of many cells (for example, 1024×768 cells). The amount of raster data and the memory capacity required for storing the raster data depend upon the number of cells. Furthermore, a plurality of spatial light modulators is arranged in a photolithography system since the exposure area is small compared to the substrate, and pattern data and memory should be prepared in accordance with the number of spatial light modulators. Therefore, the data-transform process for generating raster data and the data-transmission process need an enormous amount of time, and throughput is not improved. Particularly in the case of the multi-exposure method, the frequency of the data-transmission and data-transform processes is large compared with the shot-exposure method. Consequently, the relative movement of the table and exposure pitch is restricted due to the long period required for processing of the data.

SUMMARY OF THE INVENTION

An object of the present invention is to provide a photolithography system or method that is capable of reducing the processing time of exposure data by increasing process speed while using a simple data-processing circuit.

A photolithography system according to the present invention has at least one spatial light modulator that comprises a plurality of regularly arrayed light modulation elements, and a scanning mechanism. The scanning mechanism moves an exposure area relative to a target object in a given scanning direction, in order to scan illuminating light. The exposure area is defined as the projection area from the spatial light modulator.

The photolithography system has a plurality of memories configured to correspond to a plurality of partial exposure areas that are defined by dividing the exposure area, a data processor that successively writes exposure data into each memory in accordance with the timing of an exposure, and an exposure controller that controls the plurality of light modulating elements on the basis of the relative position of the exposure area. The plurality of memories is designated $1^{st}$ to $N^{th}$ memories. For example, the plurality of memories may be connected to each other in series.

In the present invention, the data processor writes newly generated exposure data into the first memory, and shifts exposure data stored in the $1^{st}$ to $(N-1)^{st}$ memories to the $2^{nd}$ to $N^{th}$ memories, respectively. Raster data is generated for one memory and the raster data stored in the memory is shifted to the other memories in order.

When the exposure area is slanted or rotated relative to the scanning direction by a given angle, preferably, the data processor shifts exposure data by the number of pixels corresponding to the given angle such that the exposure position of a partial exposure area are the same as those of the other partial exposure areas.

Preferably, the plurality of partial exposure areas is defined by dividing the exposure area equally. The exposure controller carries out the exposure motion at a pitch corresponding to the width of one partial exposure area.

A method for performing photolithography on a target object, according to another aspect of the present invention, includes: a.) moving an exposure area relative to the object in a scanning direction; b.) successively storing exposure data in each of a plurality of memories ($1^{st}$ to $N^{th}$ memories) in accordance with the timing of an exposure; c.) controlling the plurality of light modulating elements on the basis of the relative position of the exposure area; and d.) writing newly generated exposure data into the first memory and shifting the exposure data stored in the $1^{st}$ to $(N-1)^{st}$ memories to the $2^{nd}$ to $N^{th}$ memories, respectively.

A photolithography system according to another aspect of the present invention has at least one spatial light modulator that comprises a plurality of regularly arrayed light modulating elements; a scanning mechanism configured to move an exposure area in a scanning direction relative to a target object. The exposure area is defined as a projection area from the spatial light modulator. The photolithography system also has a data processor that generates a sequence of exposure data corresponding to a plurality of partial exposure areas that is defined by dividing the exposure area; and an exposure controller that controls the plurality of light modulating elements on the basis of the relative position of the exposure area. The data processor generates and updates head exposure data corresponding to a head partial exposure area. Note that the head partial exposure area represents an exposure area that passes firstly reaches an area to be lithographed. Then, the exposure controller carries out an exposure based on the head exposure data when each of the remaining partial exposure areas later passes an exposure position of the head partial exposure area.

A method for performing photolithography an a target object, according to another aspect of the present invention, includes: a.) scanning an exposure area in a scanning direction relative to a photosensitive material, the exposure area being defined as a projection area from at least one spatial light modulator; b.) generating a sequence of exposure data corresponding to a plurality of partial exposure areas that is defined by dividing the exposure area; c.) controlling the plurality of light modulating elements on the basis of the relative position or the exposure area; and d.) generating and updating head exposure data corresponding to a head partial exposure area; and e.) carrying out an exposure based on the head exposure data when each of remaining partial exposure areas later passes an exposure position of the head partial exposure area.

A method for manufacturing a substrate according to another aspect of the present invention includes: a.) carrying out an exposure process on a substrate covered with a photosensitive material; b.) carrying out a developing process; c.) carrying out an etching or plating process on the developed substrate; and d.) carrying out a resist removal process on the etched or plated substrate. Then, the exposure process is carried out by one of the photolithography systems described above.

BRIEF DESCRIPTION OF THE DRAWINGS

The present invention will be better understood from the description of the preferred embodiments of the invention set forth below together with the accompanying drawings, in which:

FIG. 5 is a view showing division of the exposure area.

DESCRIPTION OF THE PREFERRED EMBODIMENTS

Hereinafter, the preferred embodiments of the present invention are described with reference to the attached drawings.

Figure 1:
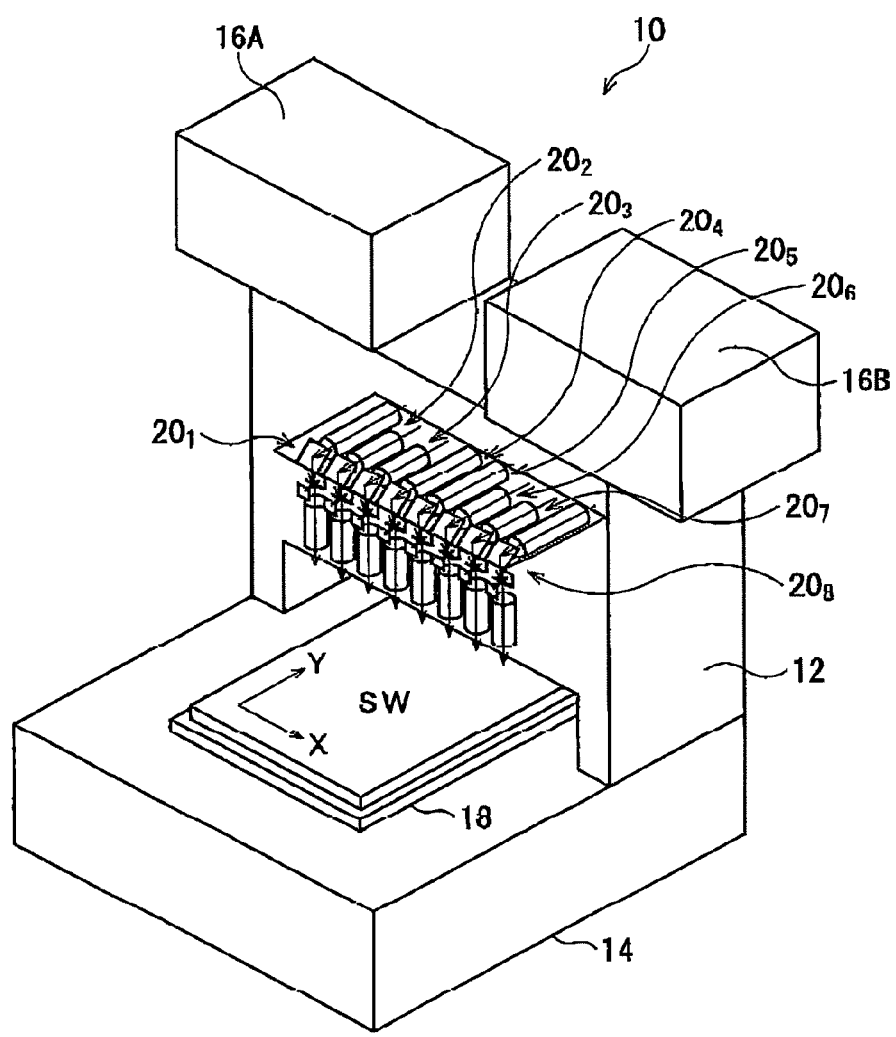
FIG. 1 is a schematic perspective view of a photolithography system according to the present embodiment.
Figure 2:
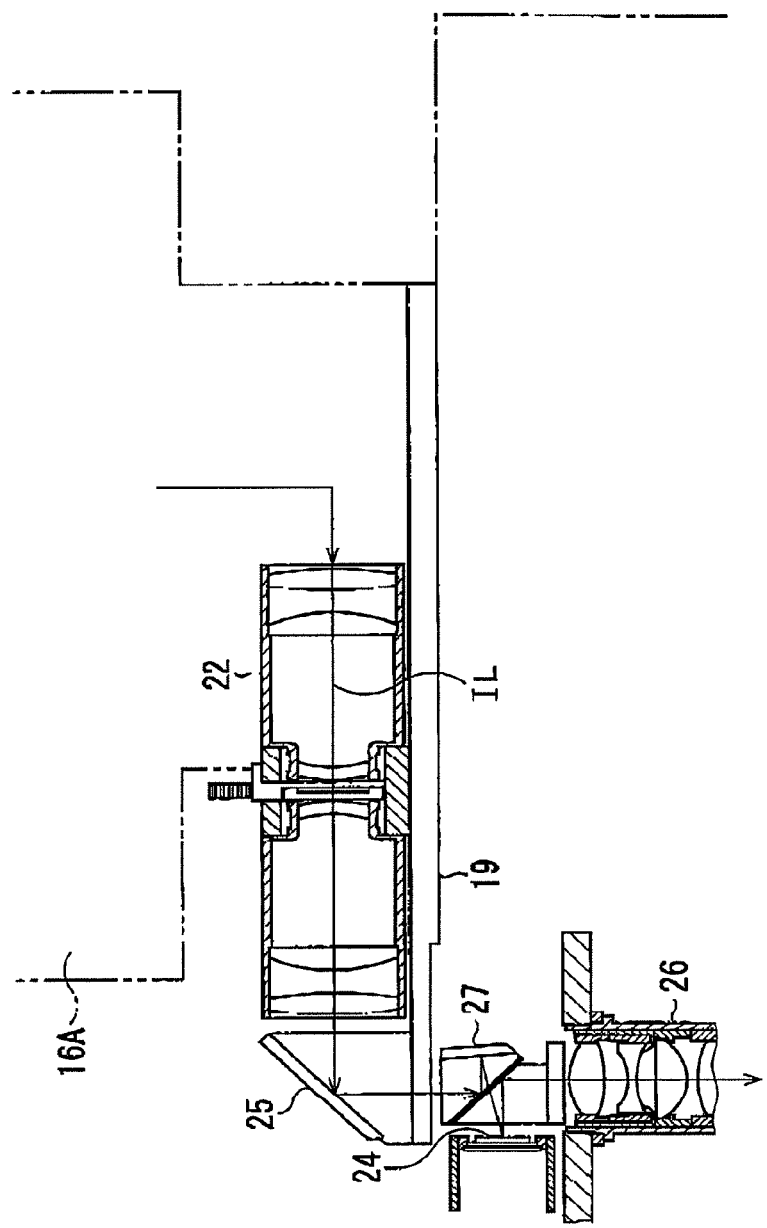
FIG. 2 in a schematic section view of an exposure unit.
Figure 3:
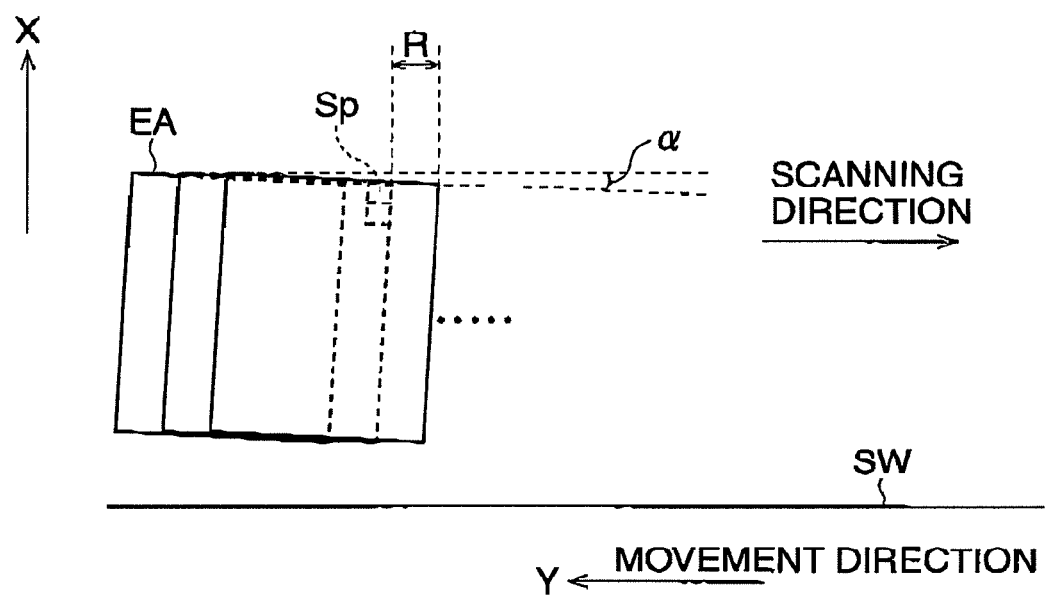
FIG. 3 is a view showing a scanning process.

FIG. 1 is a schematic perspective view of a photolithography system according to the present embodiment. FIG. 2 is a schematic section view of an exposure unit. FIG. 3 is a view showing a scanning process.

A photolithography system 10 with a gate member 12 and a base 14 is an apparatus for projecting light on a photosensitive-material-coated substrate SW in order to image or form a circuit pattern on the substrate SW. An X-Y guide mechanism 18 (not shown herein), which supports a table 18, is put on the base 14, and the substrate SW is put on the table 18.

Eight exposure units $20_1$ to $20_8$ are attached to the gate member 12. One exposure unit $20_1$ is equipped with a first illuminating optical system (not shown), a second illuminating optical system 22, a DMD 24, and an objective optical system 26 (see FIG. 2). Other exposure units $20_2$ to $20_8$ also have these components. Two light sources 16A and 16B, opposite each other in the gate member 12 supply illuminating light to the exposure units $20_1$ to $20_4$, and to the exposure units $20_5$ to $20_8$, respectively.

The substrate SW may be a silicon wafer, film, or glass board. Before the exposure process, photoresist is applied to the substrate SW and is put on the table 18 as a blank. X-Y coordinates perpendicular to each other are defined on the table 18. The table 18 moves in the Y direction. Herein, the negative Y direction is designated the scanning direction.

As shown in FIG. 2, the second illuminating optical system 22 in the exposure unit $20_1$ is arranged on a supporting member 19, which extends from the gate member 12 in the Y direction. On the other hand, the objective optical system 26 is arranged above the substrate SW along the vertical direction. The exposure unit $20_1$ also has a mirror 25, and an optical system 27. The DMD 24 is arranged opposite the mirror 25.

The light source 16A herein is a high pressure mercury lamp. Light emitted from the light source 16A is directed to the first illuminating optical system. The first illuminating optical system changes diffusion light from the light source 16A to parallel light with a uniform light intensity. Furthermore, the luminous flux of illuminating light is modified in the second illuminating optical system 22, and is directed to the DMD 24 via the mirror 25 and the optical lens 27.

The DMD 24 is constructed of rectangular micro-mirrors, which are regularly arrayed in a matrix. Herein, the DMD is composed of 1024×768 micro-mirrors. To change its position each micro-mirror is pivotable by the effect of static electricity. Specifically, each micro-mirror is maintained at the first position (the On position), which reflects the illuminating light toward the substrate W, or at the second position (the Off position), which reflects the illuminating light off the substrate SW. The position of the micro-mirrors is changed by a control signal.

In the DMD 24, each micro-mirror is switched between on and off independently in accordance with raster data, and only light reflected off the micro-mirror at the first (On) position is directed to the substrate SW. Therefore, light irradiating the substrate SW is constructed of selectively reflected luminous flux, which corresponds to the circuit pattern to be formed on a given area.

When all of the micro-mirrors are positioned at the first position, a projection spot EA is formed on the substrate SW. Hereinafter, the projection area EA is designated an "exposure area". Since the power of the objective optical system 26 is herein 1, the size of the exposure area EA coincides with that of the DMD 24. As shown in FIG. 3, the exposure area EA is slanted to the scanning direction by angle "α". The exposure unit $20_1$ is arranged such that the exposure area EA is slanted to the scanning direction. Therefore, the position of the fine spot $S_P$, formed by one micro-mirror, deviates from the X-direction perpendicular to the Y-direction. This deviation allows a higher resolution pattern to be generated.

As for the exposure method, herein, the multi-exposure method and the Step & Repeat method are applied. Therefore, table 28 intermittently moves in the Y-direction. The exposure motion is carried out each time the exposure area EA moves relative to the substrate SW by a predetermined distance RT. Each micro-mirror is turned on or off at a predetermined exposure interval. The distance RT is shorter than the size of the exposure area EA, therefore, an exposure motion is carried out so as to overlap the exposure areas. The exposure area EA intermittently moves in the scanning direction so that one scanning line's worth of circuit pattern is formed.

The exposure units $20_2$ to $20_8$ carry out an exposure process similar to that of exposure unit $20_1$. Exposure units $20_1$ to $20_8$, arrayed in the scanning direction, expose the total area of the substrate SW as the table 18 moves in the scanning direction. After the exposure process, the substrate SW is removed from the photolithography system 10, and a developing process, an etching/plating process, and a resist-removal process are carried out. Thereby, a circuit substrate, on which a pattern is formed, is generated.

Figure 4:
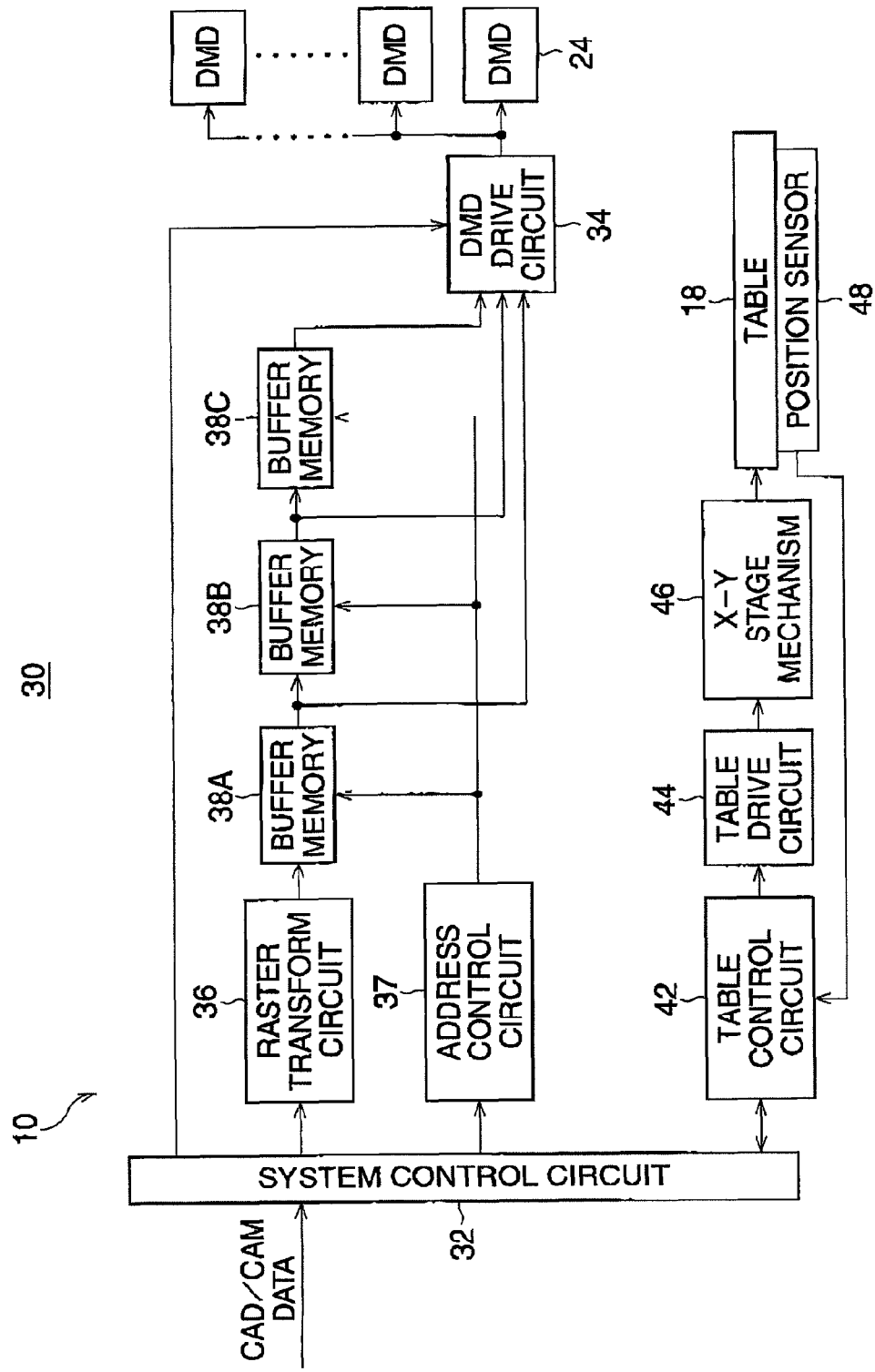
FIG. 4 is a block diagram of the photolithography system.

FIG. 4 is a block diagram of the photolithography system 10. FIG. 5 is a view showing the division of the exposure area.

An exposure controller 30 of the photolithography system 10 is connected to a workstation (not shown). The workstation outputs vector data to the exposure controller 30 as pattern data (CAD/CAM data). A system control circuit 32 controls the exposure process, and outputs control signals to a DMD drive circuit 34, an address control circuit 37, a table control circuit 38, and so on. A program for controlling the exposure process is stored in a ROM unit provided in the system control circuit 32.

Vector data transferred from the workstation includes coordinate information. A raster transform circuit 36 transforms pattern data into raster data. The generated raster data is 2-dimensional dot pattern data represented by 0s and 1s, which corresponds to an image of the circuit pattern and determines the on/off position of each micro-mirror. Raster data is generated in each exposure unit and stored in buffer memories 38A, 36B, and 38C, which connects with each other in series.

As shown in FIG. 5, three partial exposure areas EA1, EA2, and EA3 are defined by dividing the exposure area EA equally. The three partial exposure areas EA1, EA2, and EA3 are arrayed along the scanning direction in order, and the partial exposure area EA1 is the head area that initially reaches and passes an area to be exposed. Accordingly, in the DMD 24, three partial modulation areas, D1, D2, and D3, are defined. Each partial exposure area is rotated relative to the scanning direction by the width of one pixel, i.e., the size of the wine spot Sp of one micro-mirror. Therefore, the exposure area EA is slanted to the scanning direction by a total length of three pixels.

Vector data output from the workstation is prepared for only the partial exposure area EA1, namely, the partial modulation area D1. The raster data obtained by the raster transform circuit 36 is stored in the buffer memory 38A. New pattern data for the partial exposure area EA1 (the partial modulation area D1), is successively input to the exposure controller 30, and the generated raster data is stored in the buffer memory 38A every time the exposure motion is carried out. Thus, raster data is updated.

On the other hand, in accordance with the exposure motion, raster data that has been stored in the buffer memories 38A and 38B are shifted to the buffer memories 382 and 38C, respectively. The raster data stored in the buffer memory 38C is erased by the data shift. The series of raster data stored in the buffer memories 38A and 38C are transmitted to the DMD drive circuit 34 in accordance with the exposure timing. The reading and writing of raster data to the buffer memories 38A to 38C is controlled by the address control circuit 37.

The table control circuit 38 outputs control signals to the table drive circuit 44 to control the movement of the X-Y stage mechanism 46. A position sensor 48 detects a position of the table 18 to detect the relative position of the exposure area EA during scanning. Based on the detected relative position of the exposure area EA, the system control circuit 32 controls the DMD drive circuit 34 and the address control circuit 37.

The DMD drive circuit 34 has a hit map memory for storing raster data corresponding to the exposure area EA, namely, the total area of the DMD 24. Based on the raster data represented by 0 and 1, the DMD drive circuit 34 outputs on/off signals to a DMD provided in each exposure unit. Specifically, when the raster data is stored in the buffer memories 38A to 38C, control signals for controlling micro-mirrors are transmitted to each DMD while synchronizing clock pulse signals used for synchronizing an exposure-timing. Thus, micro-mirrors in each DMD are switched between on and off.

Figure 6:
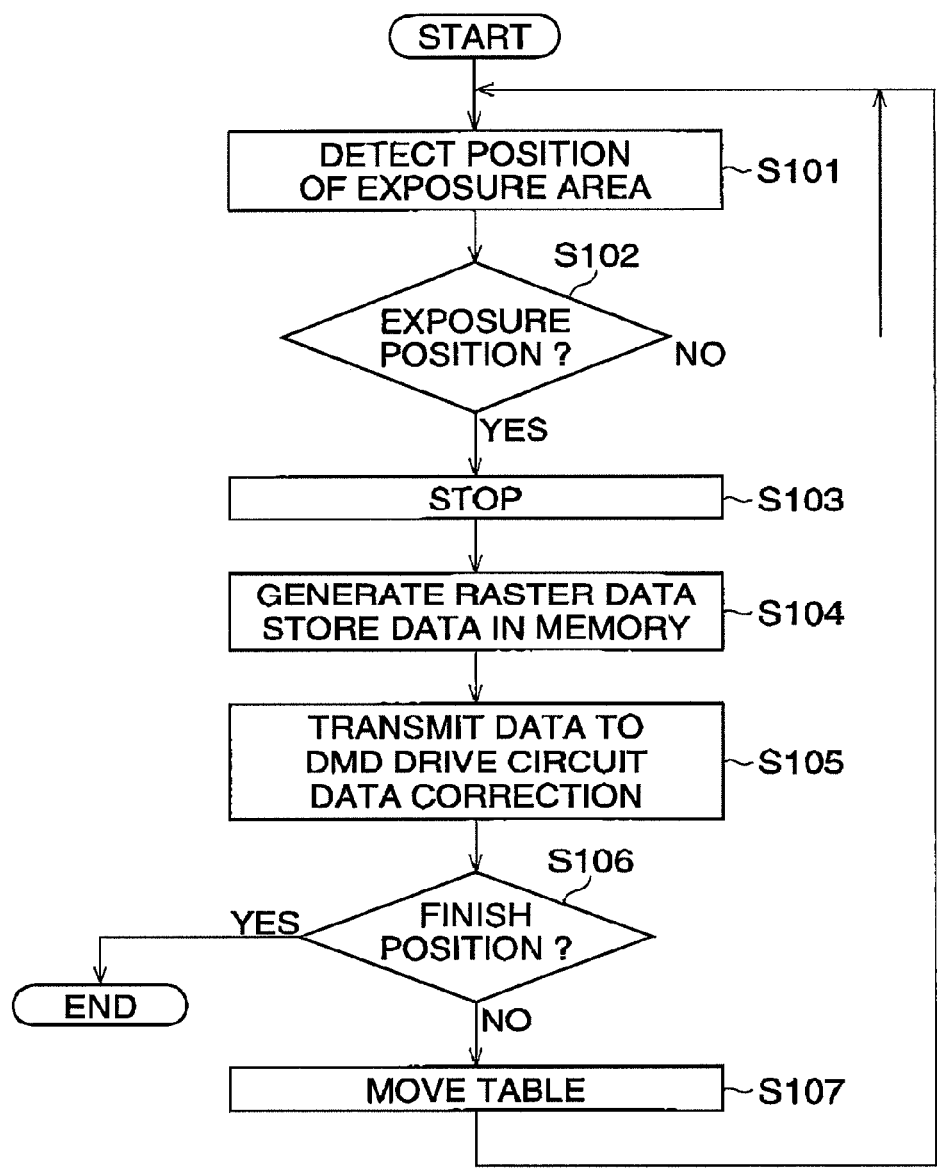
FIG. 6 is a flowchart of an exposure process performed in accordance with the Step & Repeat method and the multi-exposure method.
Figure 7:
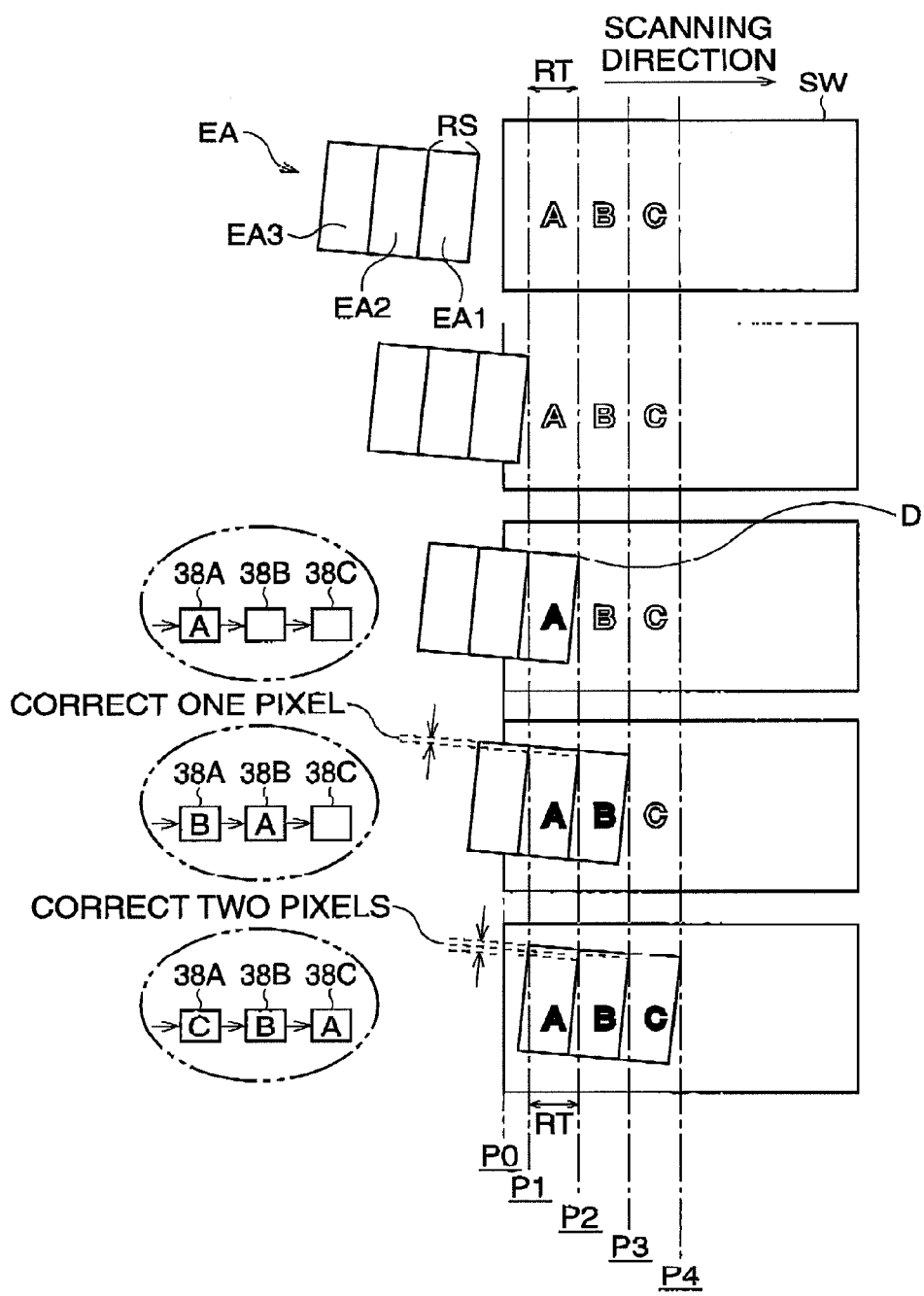
FIG. 7 is a view showing a of the exposure motion process.

FIG. 6 is a flowchart of an exposure process performed in accordance with the Step & Repeat method and the multi-exposure method. FIG. 7 is a view showing the exposure motion process. The exposure process is started by a movement of the table 18. Hereinafter, an exposure process using only one DMD is shown for simplicity. Also, character patterns "A", "B", and "C" are used in place of circuit patterns for the purpose of illustration. In FIG. 7, outlines of the patterns "A", "B" and "C" are depicted on the position to be lithographed.

The distance RT represents an exposure pitch. The exposure area EA relatively moves by the distance RT during one exposure motion. The distance RT equals the width RS of each partial exposure area. The partial exposure areas EA2 and EA3 successively reach the position of the partial exposure area EA1 while the exposure area EA moves in the scanning direction. Since the rotation angle (inclined angle) of the exposure area EA to the scanning direction is minute, each of the partial exposure areas EA2 and EA3 a substantially reaches and passes an area that the head partial exposure area EA1 has already reached. Namely, an exposure motion is carried out such that the partial exposure areas EA1, EA2, and EA3 overlap each other.

In Step S101, the relative position of the exposure area EA is detected on the basis of the position of the table 18. In Step S102, it is determined whether the exposure area EA has reached a given exposure position. In FIG. 7, the exposure motion is carried out at exposure positions P2, P3, and P4. After the exposure area has EA reached the position P2, the relative position of the exposure area EA is detected on the basis of the predetermined exposure pitch RT. Herein, the edge point D of the exposure EA is detected as the position of the exposure area EA.

When it is determined in Step S102 that the exposure area EA has not reached the exposure position, Steps S101 and S102 are repeatedly carried out until the exposure area EA has reached the exposure position. During the movement of the exposure area EA, each micro-mirror in the DMD 24 is maintained in the off state. When it is determined that the exposure area EA has reached the exposure position, the process moves to Step S103, in which the table 18 is stopped.

In Step S104, raster data is generated in the raster transform circuit 36 and the series of raster data stored in the buffer memories 38A to 38C is updated. Specifically, newly generated raster data is transmitted from the raster transform circuit 36 to the buffer memory 38A, and the raster data that was stored in the buffer memories 38B and 38C is read out and stored in the buffer memories 39A and 39B, respectively.

For example, when the partial exposure area EA1 reaches the exposure position P2, raster data for forming pattern "A" is stored in the buffer memory 38A. Raster data that turns micro-mirrors in the partial modulation areas D2 and D3 off is stored in the buffer memories 38B and 38C (see FIG. 7).

When the exposure area EA advances distance RT and reaches the exposure position P3, the partial exposure area EA2 reaches the exposure position P2 at which pattern "A" should be formed. Accordingly, newly generated raster data corresponding to the pattern "B" is stored in the buffer memory 38A. At the same time, raster data for the pattern "A" stored in the buffer memory 38A is read out and stored in the buffer memory 389. Similarly raster data stored in the buffer memory 38B is read out and stored in the buffer memory 38C.

When the exposure area EA advances distance RT and reaches the exposure position P4 that the pattern "C" is formed, the partial exposure area EA3 reaches the exposure position P3 corresponding to the pattern "B" and the partial modulation area EA3 reaches the exposure position P2 corresponding to the pattern "A". In this case, newly generated raster data for the pattern "C" is stored in the buffer memory 38A, and the raster data stored in the buffer memories 38A and 38B, corresponding to the pattern "B" and "A" respectively, is shifted to the buffer memories 38B and 38C (see FIG. 7).

In this way, when the partial exposure area EA1 to EA3 reaches the exposure positions respectively, raster data corresponding to the pattern that should be formed on the head partial exposure area EA1 is generated, and stored in the buffer memory 38A. At the same time, raster data stored in the buffer memories 38A and 38B are read out and stored in the buffer memories 38B and 38C. Note that, in the buffer memories 38A to 38C, raster data for eight DMDs are actually stored, in contrast to FIG. 7.

In Step S105, raster data corresponding to the exposure area EA is transmitted to the DMD drive circuit 34. In the DMD drive circuit 34, control signals are output to each DMD on the basis of the input raster data to control each micromirror. Thus, an exposure motion for projecting a pattern at a given exposure position is carried out. After the exposure motion is carried out, each mirror is turned off.

The writing position of the raster data on the DUD drive circuit 34 is modified in consideration of the fact that the exposure area EA is slanted or rotated in the scanning direction. As described above, the exposure area EA shifts by one pixel width's distance along the X-direction perpendicular to the scanning direction every time the exposure area EA moves distance RT. Therefore, in Step S105, the start position for reading raster data from the buffer memory 38B is shifted by one line. Thus, one-line shifted raster data is written to the DMD drive circuit 34. Also, as for the raster data stored in the buffer memory 38C, the start position for reading raster data is shifted by two lines since the partial exposure area EA3 diverges from the partial exposure area EA1 by two pixels.

In Step S106, it is determined whether the exposure area EA has reached the finish position. When it is determined that the exposure area EA has not reached the finish position, the process goes to Step S107, in which the table 18 is driven. Then, the process returns to Step S101. Steps S101 to S106 are carried out until the exposure aced EA reaches the finish position.

Thus, in the present embodiment, DMD 24 is provided in the photolithography system 10, and the exposure process is carried out by moving the exposure area EA relative to table 18 while modulating each mirror in the DMD 24. Also, the first to third partial exposure areas EA1 to EA3 are defined by dividing the exposure area EA into three equal areas. Accordingly, the first to third partial modulation areas D1 to D3 are defined on the DMD 24, and the three buffer memories 38A to 38B are provided for storing raster data corresponding to the partial modulation areas D1 to D3.

In the exposure process, vector data corresponding to the first partial exposure area EA1 (the first partial modulation area D1) is successively transmitted from the work station to the photolithography system 10, and the raster data is generated by the raster transform process and is stored in the buffer memory 38A. When the exposure area EA moves by the pitch RT corresponding to the width of one partial exposure area, newly generated raster data is stored in the buffer memory 38A, and the raster data that has been stored in the buffer memory 38A and the raster data that has stored in the buffer memory 38B are shifted to the buffer memory 38B and the buffer memory 38C, respectively. These processes to raster data are carried out every time the exposure area EA relatively advances the distance of the exposure pitch RT in accordance with the Step & Repeat method. Then, the exposure motion is performed with all of the raster data stored in buffer memories 38A to 38C.

Since only raster data for the buffer memory 38A, namely, the first partial modulation area D1 (256 cells array) is generated, time for processing raster data becomes one third compared to the process using the total DMD (768 cells array). Consequently, the photolithography process is shortened and throughput is improved. Furthermore, since individual buffer memories of small capacity can be used, the data processing speed is improved due to a simple circuit unit and overall cost is reduced.

The rotation angle of the exposure area EA to the scanning direction may optionally be set. Moreover, the exposure area may move without any rotation. As for the exposure method, a continuous movement method that moves the exposure area at a constant speed may be utilized. In this case, the generation and storage of the raster data is performed while the exposure area moves. The exposure pitch may optionally be set in accordance with the pattern to be formed on the substrate. Furthermore, one may use an overlapping exposure method that overlaps a part of the fine spots formed by the mirrors with each other. The magnification of the objective lens may be set to an arbitrary number other than 1.

The number of divisions for the exposure area (DMD) may also be optionally set for example, when the number of mirror arrays along the scanning direction is $2^M$, the exposure area may be divided into M exposure areas, and the M memories may be prepared. Also, the exposure area may be optionally divided so long as the divided areas form an array along the scanning direction. Instead of the DMD, other spatial light modulation, such as an LCD, or the like, may be used.

The buffer memories may be arrayed in parallel. Also, a larger-capacity memory may be implemented instead, and may be divided in accordance with the division of the exposure area. The photolithography system may be applied to an apparatus for forming a pattern such as characters on film or paper, such as in an electronic photographic system.

Finally, it will be understood by those skilled in the arts that the foregoing description is of preferred embodiments of the device, and that various changes and modifications may be made to the present invention without departing from the spirit and scope thereof.

The present disclosure relates to subject matter contained in Japanese Patent Application No. 2007-209528 (filed on Aug. 10, 2007), which is expressly incorporated herein, by reference, in its entirety.

The invention claimed is:

1. A photolithography system, comprising:
   at least one spatial light modulator that comprises a plurality of regularly arrayed light modulation elements;

a scanning mechanism configured to move an exposure area relative to a target object, in a given scanning direction, the exposure area being defined as a projection area of said at least one spatial light modulator, wherein a number of the light modulation elements along the given scanning direction is equal to or greater than two;

a plurality of memories configured to correspond to a plurality of partial exposure areas that is defined by dividing the exposure area equally in the scanning direction designated as $1^{st}$ to $N^{th}$ partial exposure areas, said plurality of memories being designated $1^{st}$ to $N^{th}$ memories in accordance with the $1^{st}$ to $N^{th}$ partial exposure areas;

a data processor that successively writes exposure data into each memory in accordance with a timing of an exposure; and an exposure controller having a drive circuit that controls said plurality of regularly arrayed light modulation elements on a basis of a relative position of the exposure area by outputting ON/OFF signals to the spatial light modulator, wherein each memory of the plurality of memories is independently connected to the drive circuit of the exposure controller and the exposure data stored in each memory is independently output to the drive circuit of the exposure controller in accordance with the timing of an exposure, wherein the exposure controller controls the plurality of light modulation elements on a basis of the exposure data that is output from the plurality of memories;

wherein said data processor writes newly generated exposure data into the $1^{st}$ memory, and shifts exposure data stored in the $1^{st}$ to $(N-1)^{st}$ memories to the $2^{nd}$ to $N^{th}$ memories, respectively, wherein a plurality of partial modulation areas is defined in the at least one spatial light modulator in accordance with the plurality of partial exposure areas, wherein each partial modulation area has a width along the given scanning direction that is based on a given number of light-modulation elements, and wherein the exposure controller carries out an exposure motion at an exposure pitch corresponding to the width along the given scanning direction of each partial modulation area on a basis of exposure data stored in each memory.

2. The photolithography system of claim 1, wherein the plurality of memories are connected to each other in series.

3. The photolithography system of claim 1, wherein the exposure area is slanted relative to the given scanning direction by a given angle, said data processor shifting exposure data by a number of pixels according to the given angle, such that an exposure position of a partial exposure area is the same as an exposure position of other partial exposure areas.

4. The photolithography system of claim 1, said exposure controller carrying out the exposure motion at a pitch corresponding to a width of one partial exposure area.

5. A method for manufacturing a substrate, comprising:
a.) carrying out an exposure process on a substrate covered with a photosensitive material;
b.) carrying out a developing process;
c.) carrying out an etching or plating process on the developed substrate; and
d.) carrying out a resist removal process on the etched or plated substrate,
wherein the exposure process is carried out by the photolithography system described in claim 1.

6. A method for performing photolithography on a target object, comprising:
moving an exposure area relative to the object in a given scanning direction, the exposure area being defined as a projection area from at least one spatial light modulator, said at least one spatial light modulator having a plurality of regularly arrayed light modulation elements, wherein a number of the light modulation elements along the given scanning direction is equal to or greater than two;

successively storing exposure data in each of a plurality of memories in accordance with a timing of an exposure, said plurality of memories configured to correspond to a plurality of partial exposure areas that is defined by dividing the exposure area equally in the scanning direction designated as $1^{st}$ to $N^{th}$ partial exposure areas, said plurality of memories being designated $1^{st}$ to $N^{th}$ memories in accordance with the $1^{st}$ to $N^{th}$ partial exposure areas;

controlling, by an exposure controller having a drive circuit, said plurality of regularly arrayed light modulation elements on a basis of a relative position of the exposure area by outputting ON/OFF signals to the spatial light modulator, wherein each memory of the plurality of memories is independently connected to the drive circuit of the exposure controller and the exposure data stored in each memory is independently output to the drive circuit of the exposure controller in accordance with a timing of an exposure, and wherein the exposure controller controls the plurality of light modulation elements on a basis of the exposure data that is output from the plurality of memories; and writing newly generated exposure data into the $1^{st}$ memory and shifting exposure data stored in the $1^{st}$ to $(N-1)^{st}$ memories to the $2^{nd}$ to $N^{th}$ memories, respectively, wherein a plurality of partial modulation areas is defined in the at least one spatial light modulator in accordance with the plurality of partial exposure areas, wherein each partial modulation area has a width along the given scanning direction that is based on a given number of light-modulation elements, and wherein the controlling includes carrying out an exposure motion at an exposure pitch corresponding to the width along the given scanning direction of each partial modulation area on the basis of exposure data stored in each memory.

7. A method for performing photolithography on a target object, comprising:
moving an exposure area in a given scanning direction relative to a photosensitive material, the exposure area being defined as a projection area of at least one spatial light modulator, said at least one spatial light modulator having a plurality of regularly arrayed light-modulating elements, wherein a number of the light-modulating elements along the given scanning direction is equal to or greater than two;

generating a sequence of exposure data corresponding to a plurality of partial exposure areas that is defined by dividing the exposure area equally in the scanning direction designated as $1^{st}$ to $N^{th}$ partial exposure areas;

controlling, by a drive circuit of an exposure controller, said plurality of regularly arrayed light-modulating elements on a basis of a relative position of the exposure area by outputting ON/OFF signals to the spatial light modulator, wherein each memory of a plurality of memories being designated $1^{st}$ to $N^{th}$ memories in accordance with the $1^{st}$ to $N^{th}$ partial exposure areas is independently connected to the drive circuit of the exposure controller and the exposure data stored in each memory is independently output to the drive circuit of the exposure controller in accordance with a timing of an exposure, and wherein the exposure controller controls the plurality of light-modulating elements on a basis of the exposure data that is output from the plurality of memories;

generating and updating head exposure data corresponding to a head partial exposure area; and carrying out an exposure motion based on the head exposure data when each of remaining partial exposure areas later passes an exposure position of the head partial exposure area, wherein a plurality of partial modulation areas is defined in the at least one spatial light modulator in accordance with the plurality of partial exposure areas, wherein each partial modulation area has a width along the given scanning direction that is based on a given number of light-modulation elements, and wherein the controlling further includes carrying out an exposure motion at an exposure pitch corresponding to the width along the given scanning direction.

8. A photolithography system, comprising:

at least one spatial light modulator that comprises a plurality of regularly arrayed light-modulating elements;

a scanning mechanism configured to move an exposure area in a scanning direction relative to a target object, the exposure area being defined as a projection area of said at least one spatial light modulator, wherein a number of the light-modulating elements along the scanning direction is equal to or greater than two;

a data processor that generates a sequence of exposure data corresponding to a plurality of partial exposure areas that are defined by dividing the whole exposure area equally in the scanning direction designated as $1^{st}$ to $N^{th}$ partial exposure areas; and an exposure controller having a drive circuit that controls said plurality of regularly arrayed light-modulating elements on a basis of a relative position of the exposure area by outputting ON/OFF signals to the spatial light modulator, wherein each memory of a plurality of memories being designated $1^{st}$ to $N^{th}$ memories in accordance with the $1^{st}$ to $N^{th}$ partial exposure areas is independently connected to the drive circuit of the exposure controller and exposure data stored in each memory is independently output to the drive circuit of the exposure controller in accordance with a timing of an exposure, wherein the exposure controller controls the plurality of light-modulating elements on a basis of the exposure data that is output from the plurality of memories, wherein said data processor generates and updates head exposure data corresponding to a head partial exposure area, said exposure controller carrying out an exposure based on the head exposure data when each of remaining partial exposure areas later passes an exposure position of the head partial exposure area, wherein a plurality of partial modulation areas is defined in the at least one spatial light modulator in accordance with the plurality of partial exposure areas, wherein each partial modulation area has a width along the given scanning direction that is based on a given number of light-modulation elements, and wherein the exposure controller carries out an exposure motion at an exposure pitch corresponding to the width along the given scanning direction of each partial modulation area on a basis of exposure data stored in each memory.

9. A method for manufacturing a substrate, comprising:

a.) carrying out an exposure process on a substrate covered with a photosensitive material;

b.) carrying out a developing process;

c.) carrying out an etching or plating process on the developed substrate; and d.) carrying out a resist removal process on the etched or plated substrate, wherein the exposure process is carried out by the photolithography system described in claim 8.

* * * * *